United States Patent
Gajjewar et al.

(10) Patent No.: US 7,523,420 B2
(45) Date of Patent: Apr. 21, 2009

(54) DEGENERATION TECHNIQUE FOR DESIGNING MEMORY DEVICES

(75) Inventors: Hemangi Umakant Gajjewar, Santa Clara, CA (US); Ingming Chang, San Jose, CA (US); Jungtae Kwon, San Jose, CA (US); Cezary Pietrzyk, Los Gatos, CA (US); Moon-Hae Son, San Jose, CA (US)

(73) Assignee: ARM Limited, Cambridge (GB)

( * ) Notice: Subject to any disclaimer, the term of this patent is extended or adjusted under 35 U.S.C. 154(b) by 243 days.

(21) Appl. No.: 11/506,192

(22) Filed: Aug. 18, 2006

(65) Prior Publication Data

US 2008/0046856 A1 Feb. 21, 2008

(51) Int. Cl.
*G06F 17/50* (2006.01)

(52) U.S. Cl. ............................................. 716/1; 716/2

(58) Field of Classification Search .................. 716/1–2
See application file for complete search history.

(56) References Cited

U.S. PATENT DOCUMENTS

| | | | | |
|---|---|---|---|---|
| 5,060,145 | A * | 10/1991 | Scheuneman et al. | 711/169 |
| 6,366,989 | B1 * | 4/2002 | Keskar et al. | 711/167 |
| 6,721,864 | B2 * | 4/2004 | Keskar et al. | 711/167 |
| 7,093,156 | B1 * | 8/2006 | Shubat et al. | 714/5 |
| 7,206,869 | B2 * | 4/2007 | Shishizuka et al. | 710/20 |
| 7,254,075 | B2 * | 8/2007 | Woo et al. | 365/207 |
| 2006/0067146 | A1 * | 3/2006 | Woo et al. | 365/206 |
| 2006/0277430 | A1 * | 12/2006 | Shubat et al. | 714/5 |
| 2007/0268765 | A1 * | 11/2007 | Woo et al. | 365/207 |

* cited by examiner

*Primary Examiner*—Stacy A Whitmore
(74) *Attorney, Agent, or Firm*—Nixon & Vanderhye P.C.

(57) ABSTRACT

A system, method and computer program product are provided for producing an instance of a memory device from a banked memory architecture. The banked memory architecture specifies a maximum number of memory banks and a maximum number of rows per memory bank. The method comprises the step of receiving input parameters indicating a number of properties of the memory device, the properties comprising at least a number of rows R for the memory device. Thereafter, a degeneration process is performed on the banked memory architecture in order to produce the instance of a memory device having those properties. The degeneration process comprises the steps of: (i) selecting a number of memory banks B for the instance, where the number is an integer less than or equal to the maximum number of memory banks specified by the banked memory architecture, and B is not constrained to be a factor of R; and (ii) partitioning the number of rows R amongst the selected memory banks such that in each memory bank the number of rows in that memory bank is an integer less than or equal to the maximum number of rows per memory bank specified by the banked memory architecture. This has been found to provide a very flexible technique for producing instances from a banked memory architecture allowing fine granularity in the number of rows provided, which is particularly suitable for highly banked memory architectures.

9 Claims, 9 Drawing Sheets

| Rows, <= | N, ax[N-1:0] | Bank Select | Row Select |
|---|---|---|---|
| 32 | 5 | N/A | ax[4:0] |
| 64 | 6 | N/A | ax[5:0] |
| 128 | 7 | ax[6] | ax[5:0] |
| 256 | 8 | ax[7:6] | ax[5:0] |
| 512 | 9 | ax[8:6] | ax[5:0] |

Fig. 8

DEGENERATION TECHNIQUE FOR DESIGNING MEMORY DEVICES

BACKGROUND OF THE INVENTION

1. Field of the Invention

The present invention relates to degeneration techniques for designing memory devices, and in particular to a method, computer readable medium and system for producing an instance of a memory device from a banked memory architecture using a degeneration technique.

2. Description of the Prior Art

There is a continuing trend for the storage requirements of memory devices to increase, as a result of which the size and complexity of those memory devices also tends to increase. However, the larger the memory device, the more power is likely to be consumed accessing it, and the slower the access is likely to be. In order to seek to improve the speed of access and reduce the power consumption, it is known to produce banked memory designs, where the memory device is arranged as a plurality of banks. As a result, accesses can be made to the individual banks, rather than to the memory device as a whole, thereby improving the speed of access and reducing the power consumption.

When designing banked memory devices, there are two general approaches that can be taken. In accordance with a first approach, the memory device can be custom designed for a particular implementation, which can lead to an efficient design. However, the disadvantage of such an approach is that there is little chance of re-using that design in different implementations and accordingly such an approach is costly. In accordance with an alternative approach, a banked memory architecture is developed, and then a memory compiler tool is used to create an instance (i.e. a particular instantiation) of that banked memory architecture to form the design of a required memory device having regard to some required properties of that memory device.

In producing an instance of a memory device from a specified banked memory architecture, the compiler tool may perform a degeneration process in which the rows in each bank can be degenerated in order to produce instances of the memory device containing less rows than the maximum possible. One such known degeneration process is illustrated schematically in FIG. 1. In accordance with the banked memory architecture illustrating in FIG. 1, four banks are provided, each pair of banks sharing peripheral logic 50, such peripheral logic consisting of column decoders, sense amp logic, control circuits, etc as will be understood by those skilled in the art. In accordance with the banked memory architecture to which FIG. 1 applies, it is assumed that the maximum number of rows per memory bank is 64, and accordingly the instance 10 represents the largest memory device that can be produced using the banked memory architecture. As shown in FIG. 1, the instance 10 consists of the four banks 12, 14, 16, 18, each bank containing 64 rows, and each pair of banks sharing peripheral logic 50.

However, the person using the compiler tool may indicate that they require less than that number of rows. Applying the degeneration process, this may result in the production of an instance having less than the maximum number of rows, for example the instance 20 where each of the four banks 22, 24, 26, 28 have 62 rows. However, in accordance with this known degeneration technique, the row degeneration in each bank is constrained to be the same, and accordingly there is no possible instance between the instance 10 and the instance 20. Similarly, the next smaller possibility following the instance 20 is the instance 30 where the four banks 32, 34, 36, 38 each have 60 rows therein. The minimum size possible will be dictated by the minimum allowable number of rows per bank, which may for example be eight rows per bank as shown by the instance 40 of FIG. 1 where each of the banks 42, 44, 46, 48 have eight rows.

Hence, whilst the maximum sized instance will provide 256 rows, the next available instance 20 will provide 248 rows. Accordingly, such an approach leads to a fairly coarse granularity between the available number of rows, as illustrated schematically by FIG. 2 which is a diagram illustrating delay as a function of size. The symbols a, b, c, d in FIG. 2 correspond to the four instances 10, 20, 30, 40 illustrated in FIG. 1. Considering instance 30, this provides 240 rows. If the person using the compiler wants to design a memory device having 240 rows, then instance 30 would be generated. However, if that person wishes to produce a memory device having 242 rows, then in accordance with this degeneration technique the instance 20 needs to be adopted, which as discussed earlier has 248 rows, i.e. six rows which are not necessary for the indicated device. As a result, from FIG. 2 it will be seen that due to the need to produce a memory device according to instance 20, the resultant jump in access delay is relatively coarse, potentially putting pressure on the designer to find a way of removing the need for the two additional rows, i.e. thereby enabling the instance 30 to be adopted.

Coupled with this problem, there is a continuing trend for memory architectures to become more highly banked, i.e. to include more and more banks, and from the above description of FIGS. 1 and 2 it will be appreciated that as more banks are included, the coarseness between the possible instances becomes even greater. Hence, considering the earlier example, the delay penalty resulting from the requirement for the two extra rows becomes even larger.

Additionally, it will be appreciated from FIG. 1 that as the memory device instance decreases in size, the efficiency of the resultant memory device is reduced due to the relative overhead of the peripheral logic 50. In particular, it can be seen that when adopting the instance 10 the peripheral logic 50 is shared between 128 rows, whilst when adopting the instance 40, the peripheral logic 50 is shared between 16 rows. Hence, the area required to produce a memory device according to the instance 40 is less efficient than the area required to produce the instance 10.

Accordingly, it would be desirable to provide an improved technique for producing instances of memory devices from a banked memory architecture.

SUMMARY OF THE INVENTION

Viewed from a first aspect, the present invention provides a method of producing an instance of a memory device from a banked memory architecture, the banked memory architecture specifying a maximum number of memory banks and a maximum number of rows per memory bank, the method comprising the steps of: (a) receiving input parameters indicating a number of properties of said memory device, said properties comprising at least a number of rows R for said memory device; (b) performing a degeneration process on the banked memory architecture in order to produce said instance of a memory device having said properties, the degeneration process comprising the steps of: (i) selecting a number of memory banks B for said instance, where said number is an integer less than or equal to the maximum number of memory banks specified by the banked memory architecture, and B is not constrained to be a factor of R; and (ii) partitioning the number of rows R amongst said memory banks selected at said step (b)(i) such that in each memory bank the number of rows in that memory bank is an integer less than or equal to the maximum number of rows per memory bank specified by the banked memory architecture.

In accordance with the present invention, the degeneration process applied involves selecting the number of memory banks for the instance and then partitioning the required number of rows amongst those memory banks. In accordance with the present invention, the number of memory banks B is not constrained to be a factor of the number of rows R for the memory device determined at step (a). As a result, when partitioning the rows amongst the memory banks, the rows will not necessarily be spread evenly amongst the memory banks, i.e. each memory bank will not necessarily contain the same number of rows. By providing the degeneration process with the freedom to select the number of memory banks to use, up to the maximum number of memory banks specified by the banked memory architecture, and then partitioning the number of rows for the memory device amongst those selected memory banks, this enables a much finer granularity in the number of rows that can be provided, and leads to a more efficient design. As an example of the efficiency that can be gained, if we consider the instance 40 produced by the prior art degeneration scheme of FIG. 1 based on a requirement for a design with 32 or less rows, it will be appreciated that through use of the present invention it would be possible to instead generate an instance having a single bank containing 32 rows, thus requiring only a single piece of peripheral logic and a simpler addressing scheme.

The manner in which the memory banks are selected when performing the degeneration process can take a variety of forms. However, in one embodiment the selection step is performed so as produce as said instance an instance having the minimum number of memory banks required for said memory device to have the indicated properties. This approach has been found to lead to the most efficient implementation, particularly in highly banked memory architectures.

The way in which the rows are partitioned amongst the memory banks can take a variety of forms. However, in one embodiment such partitioning is performed so as to provide the maximum number of rows per memory bank in at least all but one of said memory banks of said instance. Accordingly, some instances may be produced where all of the selected memory banks have the maximum number of rows provided therein, whilst any other instances will be produced having the maximum number of rows in all but one of the memory banks. This has been found to provide a particularly efficient implementation, whilst supporting the fine granularity in the number of rows that can be catered for when producing an instance from the banked memory architecture.

In one embodiment, the banked memory architecture specifies peripheral logic along with a pair of memory banks. That peripheral logic will include circuit elements such as column decoders, sense amp logic, control circuitry, etc. Some circuitry of the peripheral logic will be shared between the pair of memory banks, and some circuitry will be unique to a particular one of the memory banks of the pair. Assuming the maximum number of memory banks is an even number, then if the degeneration process selects a number of memory banks which is less than the maximum number of memory banks by an even number, this will mean that the particular instance in question will not include at least one pair of memory banks that would have been available, and accordingly the peripheral logic provided with any such pair also need not be included within the instance. This hence enables efficiency savings to be realised by avoiding any unnecessary inclusion of peripheral logic.

However, if when performing the degeneration process an odd number of memory banks are selected, then this means that one of the memory banks will be unpaired. In one embodiment, in such situations, the degeneration process further comprises the step of performing a removal process to remove one or more components from any peripheral logic that is associated with an unpaired memory bank. Accordingly, by way of example, any components within that peripheral logic that are unique to the memory bank that in fact is not being included within the particular instance design can be removed, to thereby lead to a "trimmed down" version of the peripheral logic for use with the unpaired memory bank. As a result, a further improvement in efficiency is realised in the resultant instance design.

The input parameters indicating the properties of the memory device can take a variety of forms. In one embodiment, those input parameters may directly specify the properties of the memory device. However, in alternative embodiments, the properties are derived from the input parameters rather than the input parameters specifying them directly. In one such embodiment, when deriving the number of rows R, the number of rows is selectable as any multiple of two less than or equal to a maximum number of rows supported by the banked memory architecture. Hence, at most, the instance derived by the degeneration logic will provide one more row than was actually desired by the entity producing the input parameters, for example a user of the compiler tool.

In one particular embodiment, the input parameters comprise a number of words to be stored by the memory device, a multiplexer size for the memory device and a number of input/output bits for the memory device, and said number of properties are derived therefrom, said properties comprising said number of rows R and a number of columns for said memory device. In particular, the number of rows can be calculated by dividing the number of words by the multiplexer size. Further, the number of columns can be derived by multiplying the number of input/output bits by the multiplexer size.

Viewed from a second aspect, the present invention provides a computer readable medium carrying a computer program, the computer program being operable to cause a computer system to perform a method for producing an instance of a memory device from a banked memory architecture, the banked memory architecture specifying a maximum number of memory banks and a maximum number of rows per memory bank, the method comprising the steps of: (a) receiving input parameters indicating a number of properties of said memory device, said properties comprising at least a number of rows R for said memory device; (b) performing a degeneration process on the banked memory architecture in order to produce said instance of a memory device having said properties, the degeneration process comprising the steps of: (i) selecting a number of memory banks B for said instance, where said number is an integer less than or equal to the maximum number of memory banks specified by the banked memory architecture, and B is not constrained to be a factor of R; and (ii) partitioning the number of rows R amongst said memory banks selected at said step (b)(i) such that in each memory bank the number of rows in that memory bank is an integer less than or equal to the maximum number of rows per memory bank specified by the banked memory architecture.

Viewed from a third aspect, the present invention provides an instance of a memory device produced from a banked memory architecture by performing a method in accordance with the first aspect of the present invention.

Viewed from a fourth aspect, the present invention provides a system for producing an instance of a memory device from a banked memory architecture, the banked memory architecture specifying a maximum number of memory banks and a maximum number of rows per memory bank, the system comprising: an input for receiving input parameters indicating a number of properties of said memory device, said properties comprising at least a number of rows R for said memory device; degeneration logic for performing a degeneration process on the banked memory architecture in order to produce said instance of a memory device having said properties, the degeneration process comprising the steps of: (i) selecting a number of memory banks B for said instance, where said number is an integer less than or equal to the maximum number of memory banks specified by the banked memory architecture, and B is not constrained to be a factor of R; and (ii) partitioning the number of rows R amongst said memory banks selected at said step (i) such that in each memory bank the number of rows in that memory bank is an integer less than or equal to the maximum number of rows per memory bank specified by the banked memory architecture.

The way in which the rows are partitioned amongst the memory banks can take a variety of forms. However, in one embodiment such partitioning is performed so as to provide the maximum number of rows per memory bank in at least all but one of said memory banks of said instance. Accordingly, some instances may be produced where all of the selected memory banks have the maximum number of rows provided therein, whilst any other instances will be produced having the maximum number of rows in all but one of the memory banks.

BRIEF DESCRIPTION OF THE DRAWINGS

The present invention will be described further, by way of example only, with reference to embodiments thereof as illustrated in the accompanying drawings, in which:

FIG. 8 is a table illustrating examples of instance designs that can be produced when employing the degeneration scheme of one embodiment of the present invention.

DESCRIPTION OF EMBODIMENTS

Figure 3:
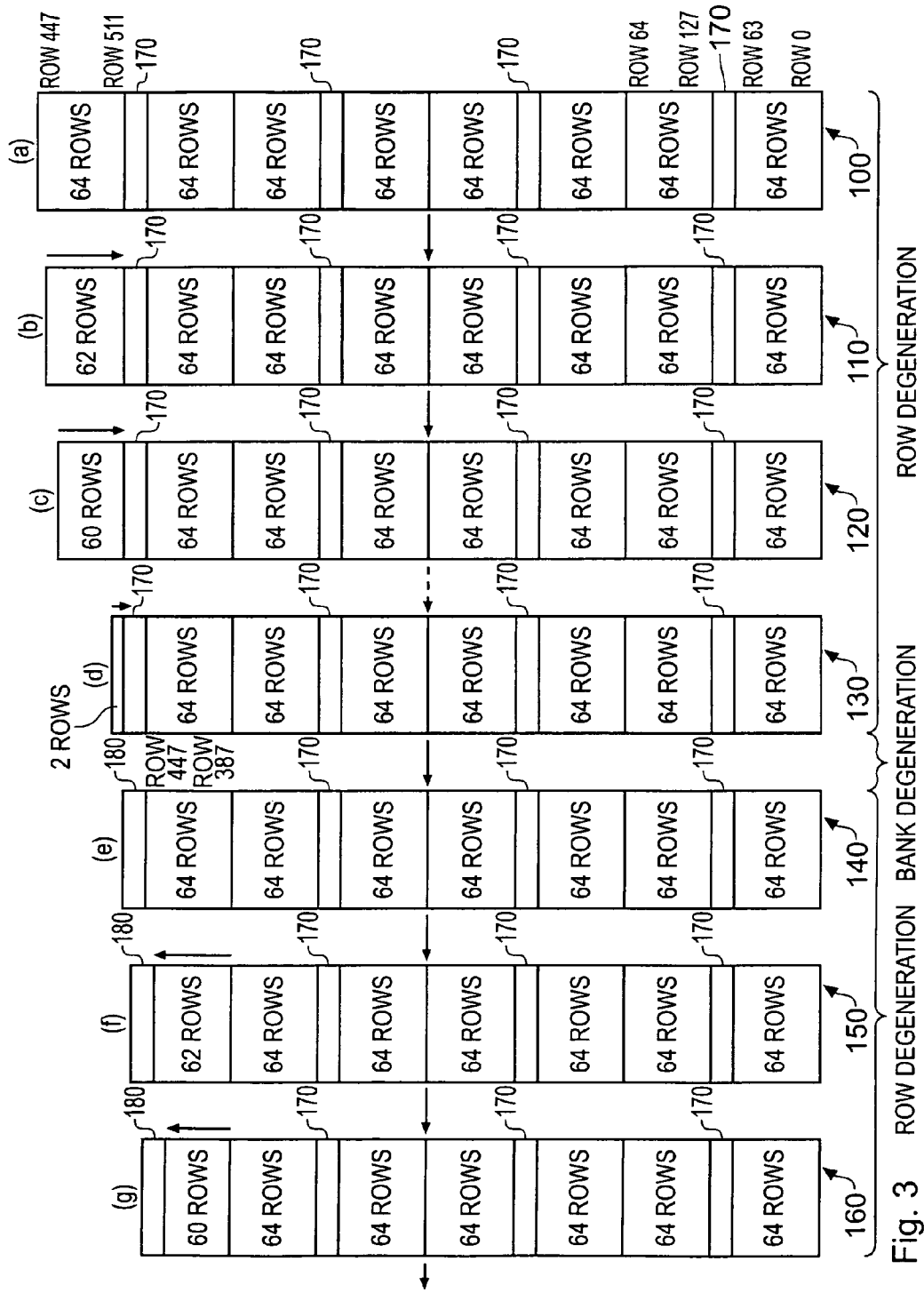
FIGS. 3 and 4 are diagrams schematically illustrating a degeneration scheme in accordance with embodiments of the present invention.
Figure 4:
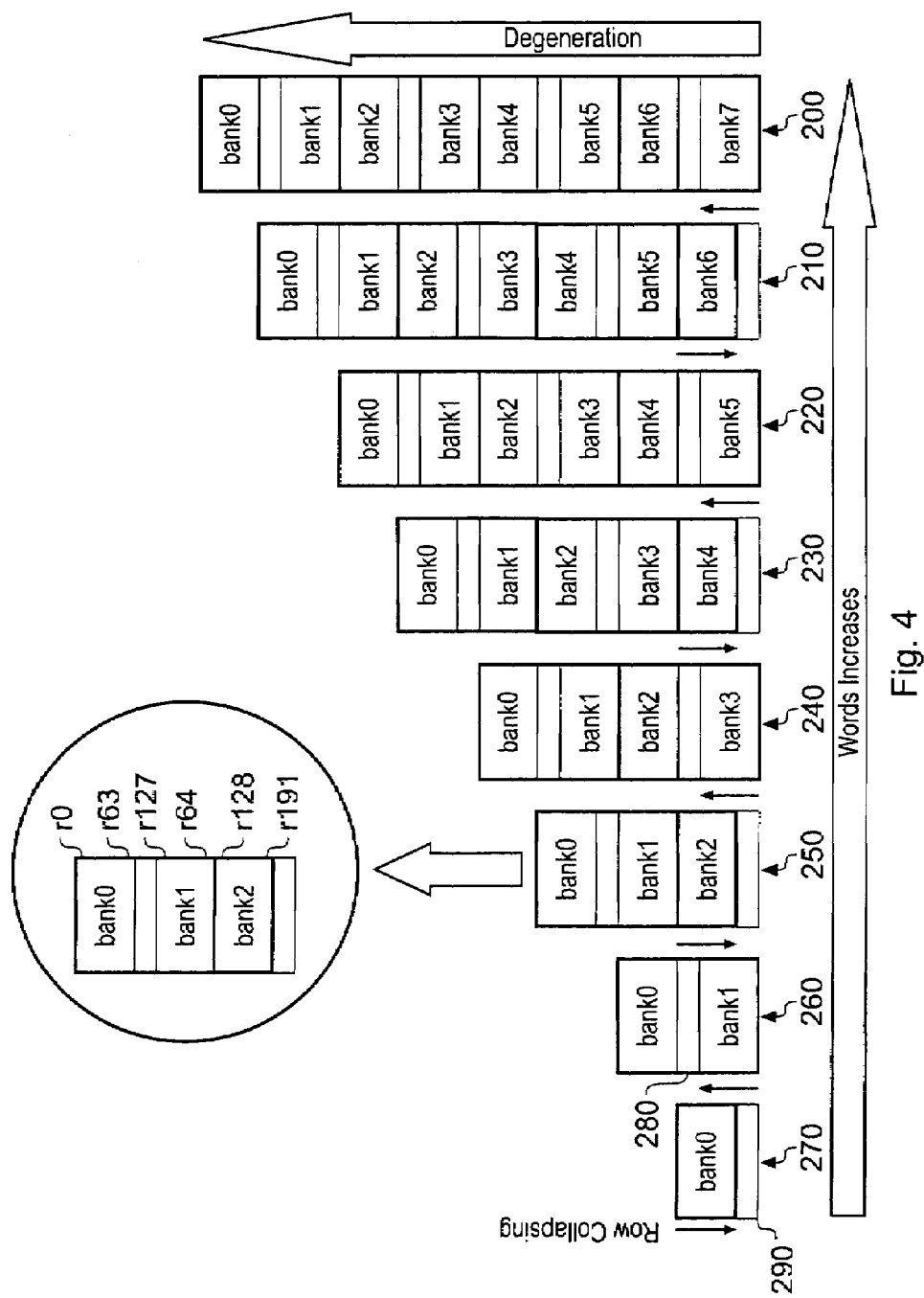

FIGS. 3 and 4 are diagrams schematically illustrating the degeneration scheme employed in accordance with one embodiment of the present invention. Looking first at FIG. 3, a series of instances 100, 110, 120, 130, 140, 150, 160 that may be produced by the degeneration scheme of an embodiment of the present invention are illustrated. As can be seen, the first instance 100 consists of eight banks, each bank having 64 rows therein. Each pair of banks shares peripheral logic 170, which as discussed earlier will include column decoder, sense amp, control circuits, etc required to access the memory cells within the associated banks. The instance 100 in this embodiment represents the largest instance of memory device that can be produced from the banked memory architecture, the banked memory architecture having specified a maximum number of memory banks to be eight and a maximum number of rows per bank to be 64. The maximum number of memory banks will normally form part of a product definition for the banked memory architecture, and the maximum number of rows per memory bank will typically be a matter of design choice for the person who is defining the banked memory architecture. As will be appreciated by those skilled in the art, when producing a banked memory architecture, the maximum number of rows per bank will typically be determined having regard to external industry information, for example foundry bit cell information identifying the properties of the bit cells that will be used to make up the memory device. Required performance and/or power characteristics may also be taken into account when determining the maximum number of rows per bank, optionally combined with foundry information.

In accordance with the embodiment of the present invention shown in FIG. 3, the degeneration process is able to collapse rows in increments of two, as shown by the instances 110, 120, 130 shown in FIG. 3. Accordingly, instance 110 still consists of eight banks, seven of which have the maximum 64 rows, and the last one of which has 62 rows. Similarly, instance 120 has seven banks with 64 rows, and an eighth bank with 60 rows. This row degeneration process can continue all the way to instance 130 which has seven banks with 64 rows and one bank with two rows.

If the number of rows determined from the input parameters to the degeneration scheme is less than that provided by instance 130, then in accordance with the degeneration scheme of the embodiment of the present invention, bank degeneration can take place in order to select as a design an instance having only seven banks rather than eight, as illustrated by the instance 140 shown in FIG. 3 which has seven banks, each with the maximum number of rows, i.e. 64 rows. Thereafter, row degeneration can continue in increments of two rows to produce the instances 150, 160, etc.

In accordance with one embodiment of the present invention, peripheral logic 170 is provided between each associated pair of banks. However, as will be appreciated when considering the instances 140, 150, 160, in these designs there is an unpaired bank, namely the bank at the top of those instances as drawn in FIG. 3. In accordance with one embodiment of the present invention, the degeneration process includes a step of modifying the peripheral logic design 170 in order to produce a peripheral design 180 where any unnecessary components that would be specific to the bank that is no longer being provided are removed.

The layout of each bank can take a variety of forms. In accordance with one embodiment of the present invention, the layout of each adjacent bank is reversed and hence for example looking at the bottom two banks of the instance 100, the first bank starts with row zero and extends to row 63, whilst the next bank has row 64 at the top and row 127 at the bottom. As a result, the top bank in instance 100 has row 447 at the top and row 511 at the bottom. Hence, as indicated by the downwardly pointing arrows in instances 110 and 120, rows are shed in the direction indicated by those arrows, such that for example when moving from instance 100 to instance 110, row 511 and row 510 are removed. In contrast, when considering the instance 140, the uppermost bank has row 387 at the bottom and row 447 at the top. Accordingly, when performing row degeneration to produce instances 150, 160, etc, rows are shed in the direction indicated by the upwardly pointing arrows provided in association with instances 150, 160.

By reversing the layout of each adjacent row, the design of the intervening peripheral logic 170 can be significantly simplified.

In FIG. 3, it is assumed that the bank address starts from the bottom of the instance and as can be seen, as the number of words required reduces, rows and/or banks are shed from the top of the memory. However, in an alternative embodiment, the bank address can start from the top of the instance, in which case as the number of words required reduces, rows and/or banks will typically be shed from the bottom of the memory. Such an arrangement is shown in FIG. 4, which omits the detail of the row degeneration illustrated in FIG. 3, and instead merely illustrates the bank degeneration that can take place in accordance with embodiments of the present invention. Accordingly, starting with the instance 200, row degeneration can take place in the direction of the upwardly pointing arrow as illustrated adjacent instance 200, but if 448 rows or less are required (assuming a maximum of 64 rows per bank), then instance 210 can instead be adopted having only seven banks. Similarly, if 384 rows or less are required, the instance 220 can be adopted having only six banks. Similar bank degeneration processes can be performed to produce the instances 230, 240, 250, 260, 270. Between each bank degeneration step illustrated in FIG. 4, row degeneration can take place in accordance with the process described earlier with reference to FIG. 3, for each bank arrangement shown in FIG. 4, the adjacent arrow indicating the direction in which rows are collapsed when performing such row degeneration.

FIG. 4 also shows an expanded view of the instance 250, to again illustrate how the layout of adjacent banks is reversed in one embodiment of the present invention.

In a similar way to that discussed earlier with reference to FIG. 3, any pair of banks will have provided in association therewith peripheral logic 280. However, a modified version of that peripheral logic 290 can be produced for any unpaired bank, i.e. for bank zero in instance 270, for bank two in instance 250, for bank four in instance 230, or for bank six in instance 210.

Whilst in FIGS. 3 and 4 the bank address is ordered, starting from either the bottom of the instance or the top of the instance, respectively, in other embodiments the bank address may be randomly ordered. In particular, it is not important where any particular bank physically resides in the instance, and the degeneration process will continue to start from the top bank address, irrespective of where that bank physically resides.

Figure 5:
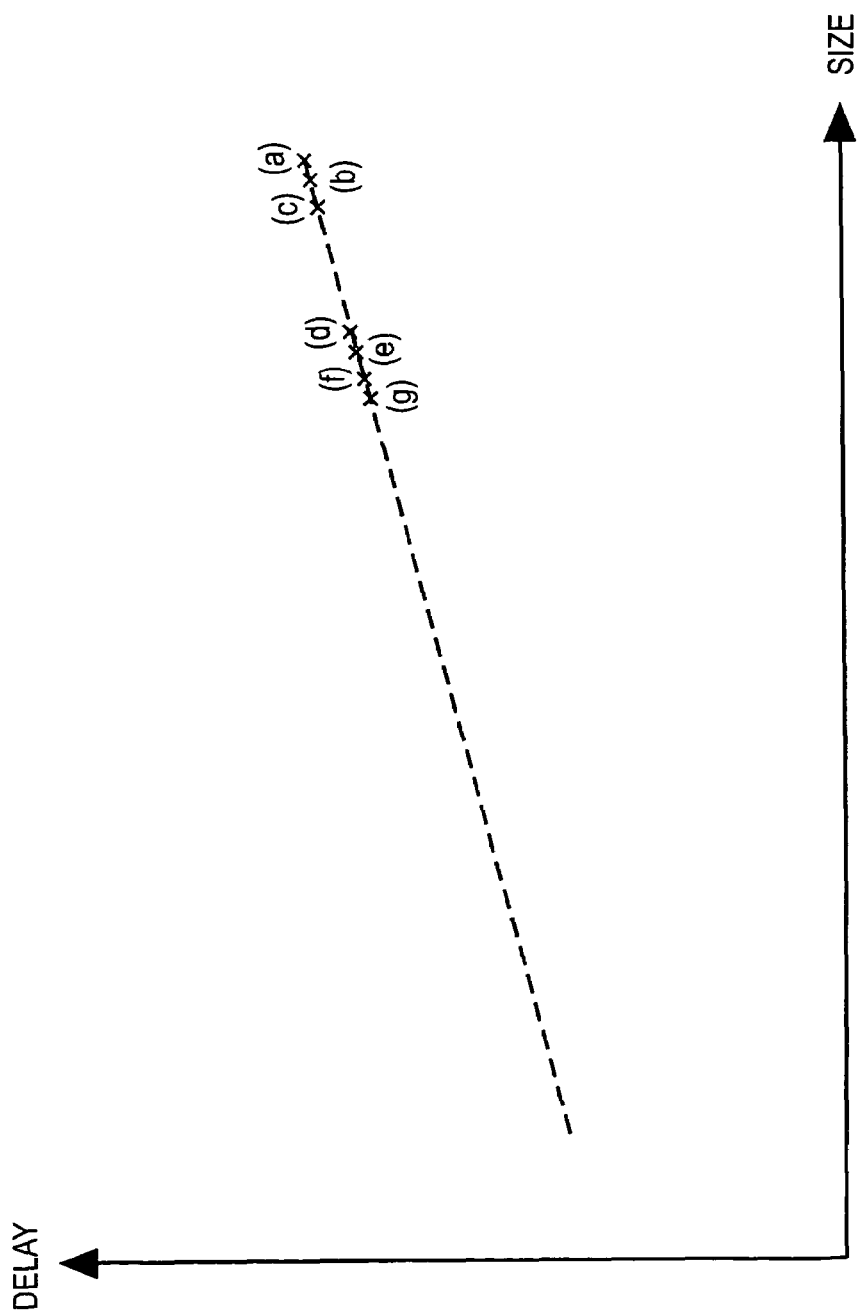
FIG. 5 is a diagram schematically illustrating the fine increments between instances produced by the degeneration scheme of an embodiment of the present invention.

FIG. 5 is a chart illustrating the much finer level of granularity that can be achieved when adopting the degeneration scheme of the above-described embodiment of the present invention, when compared with the prior art degeneration scheme illustrated earlier with reference to FIG. 2. The symbols a, b, c, d, e, f and g correspond to the seven instances 100, 110, . . . , 160 shown in FIG. 3.

As will be appreciated from FIGS. 3 and 4, for any choice of input parameters entered by a user, the number of rows provided by the resultant instance will at worst have one more row than is actually required given the input parameters specified, due to the fact that rows are collapsed in increments of two. Accordingly, for any desired size of memory device conforming to the banked memory architecture, an instance can be generated which closely matches the user's requirements, and hence avoids the need to produce a design having a coarser delay.

Figure 1:
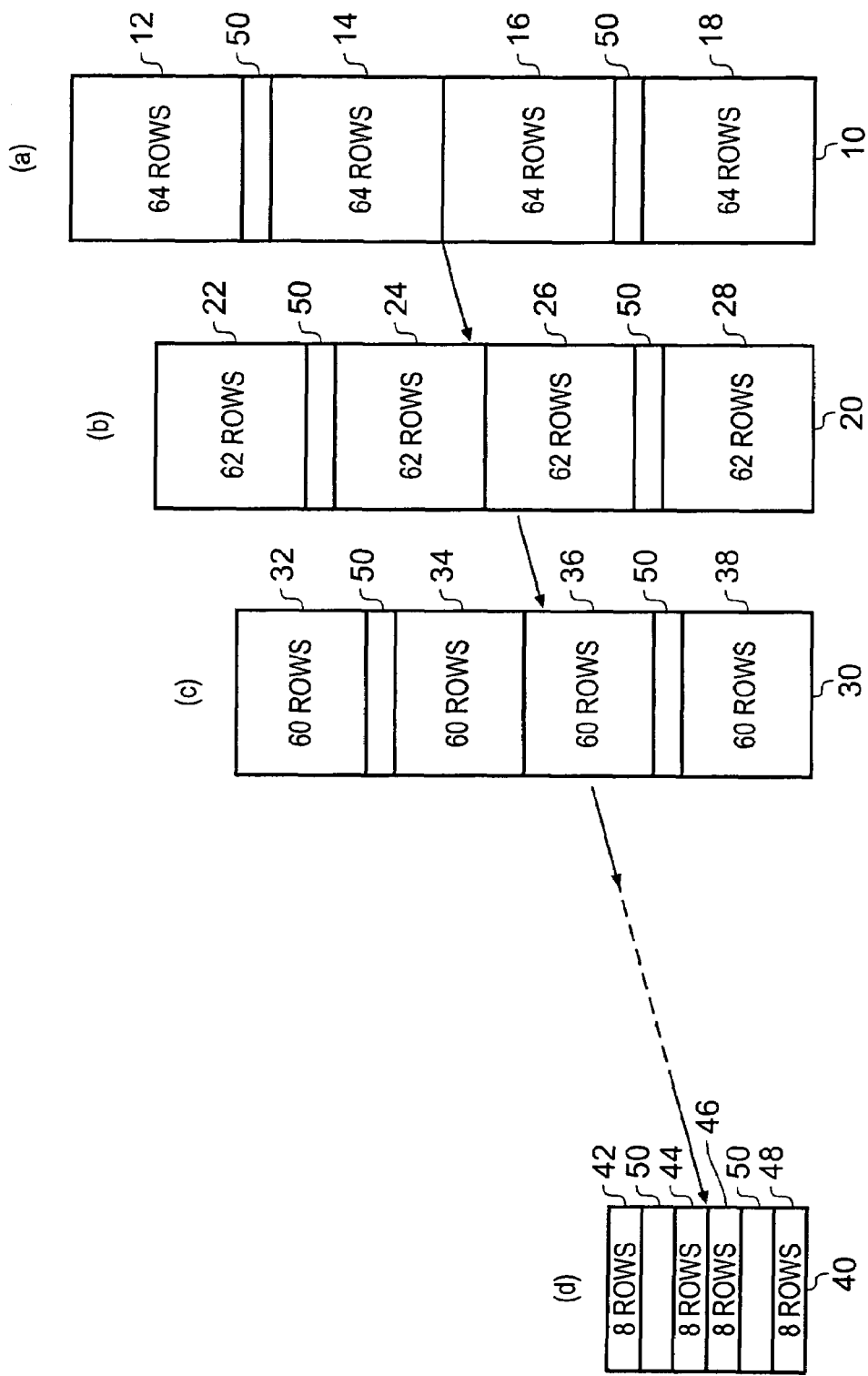
FIG. 1 is a diagram schematically illustrating a prior art degeneration scheme.
Figure 2:
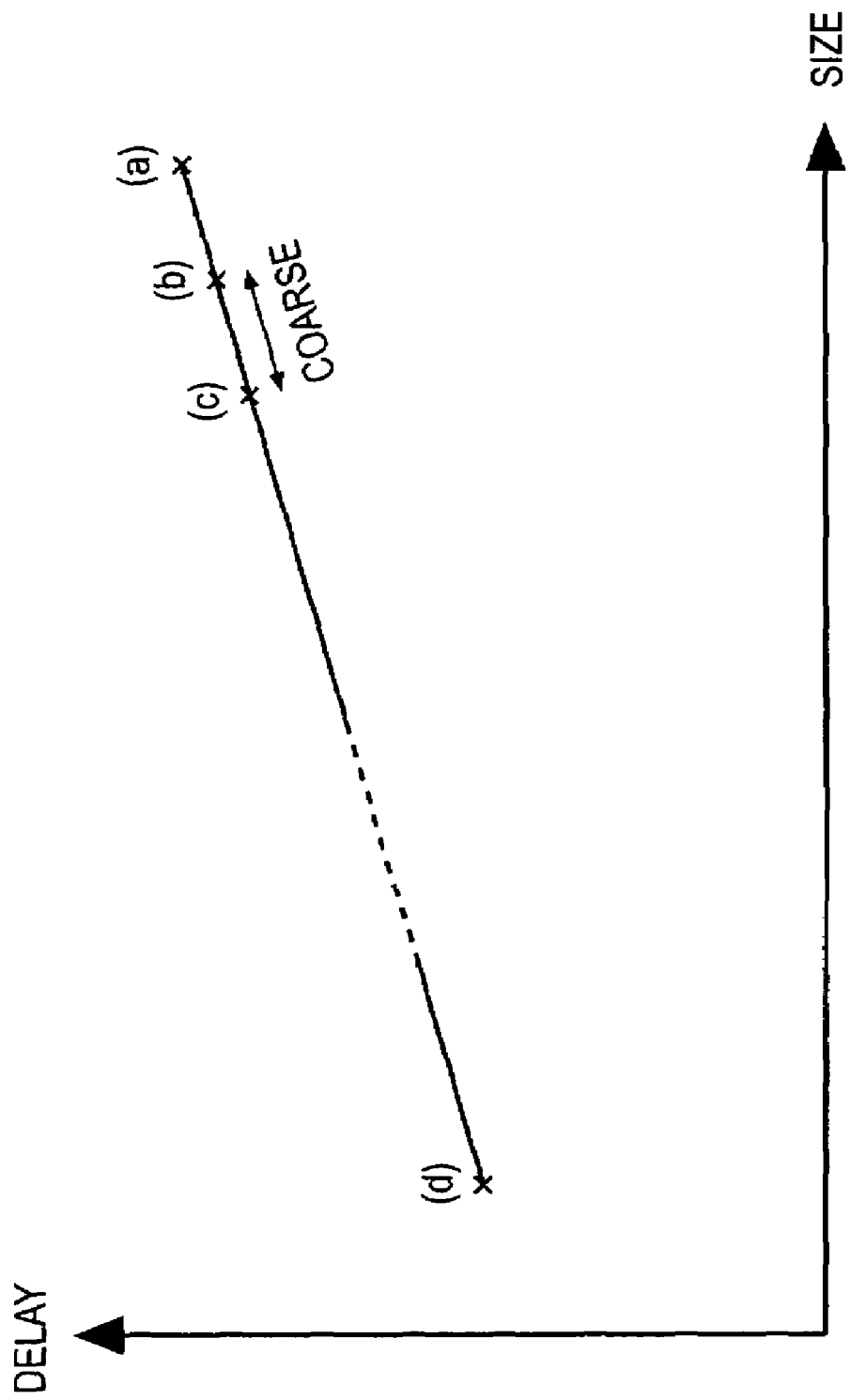
FIG. 2 is a diagram schematically illustrating the coarse nature of the increments between particular instances produced by the degeneration scheme of FIG. 1.
Figure 6A:
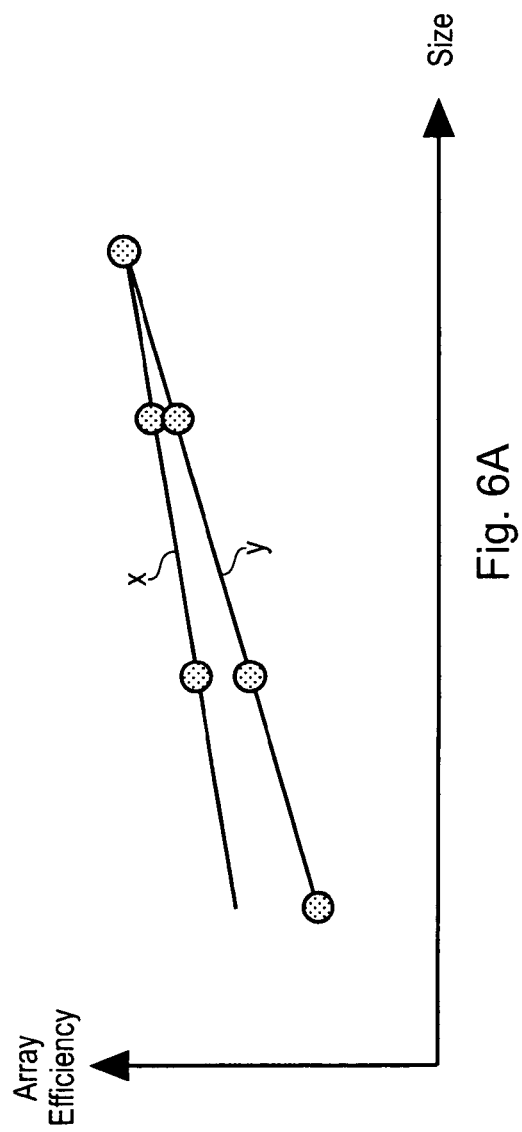
FIGS. 6A and 6B are diagrams contrasting the results achievable using the degeneration scheme of embodiments of the present invention and the prior art degeneration scheme of FIGS. 1 and 2.
Figure 6B:
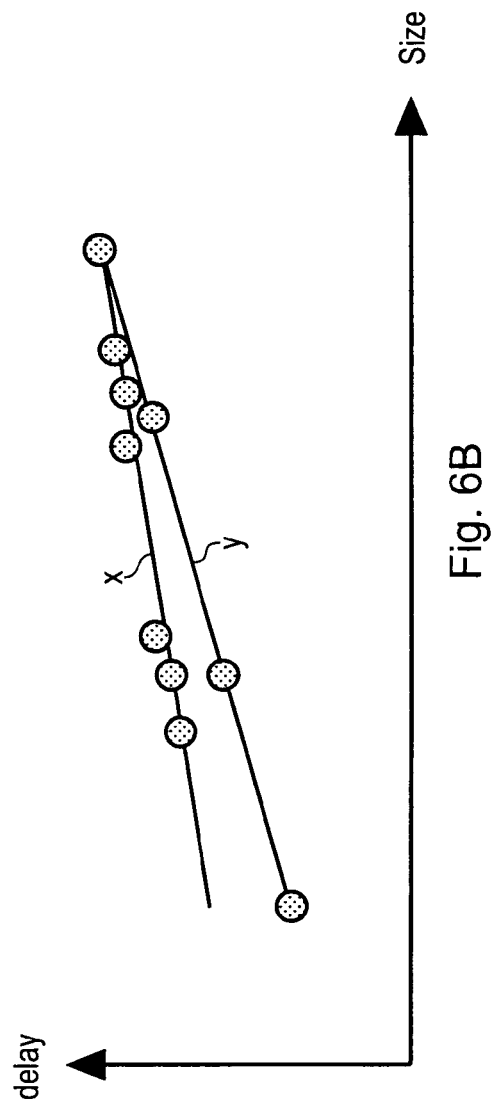

FIGS. 6A and 6B are diagrams contrasting the results achievable using the degeneration scheme of embodiments of the present invention and the prior art degeneration scheme of FIGS. 1 and 2. In particular considering FIG. 6A, this illustrates array efficiency for both the scheme of an embodiment of the present invention (as indicated by line "X" in FIG. 6A) and the prior art scheme discussed earlier with reference to FIGS. 1 and 2 (as indicated by line "Y" in FIG. 6A). Array efficiency is defined as active memory cell area in a memory instance over total memory instance area. FIG. 6A clearly illustrates that for any particular size less than the maximum possible size (as defined by the maximum number of banks and maximum number of rows per bank), the degeneration scheme of embodiments of the present invention achieves a higher array efficiency than the prior art scheme.

FIG. 6B illustrates delay against size and illustrates the finer level of granularity that can be achieved when adopting the degeneration scheme of embodiments of the present invention, when compared with the prior art degeneration scheme illustrated earlier with reference to FIG. 2 (again line "X" indicates the results achieved using the degeneration scheme of embodiments of the present invention, and the line "Y" indicates the results achieved using the prior art scheme).

It should be noted that FIG. 6B is only intended as a schematic illustration and the exact form of the curve X will be dependent on embodiment. In particular, whilst curve X is shown schematically as a straight line in FIG. 6B, it may well in at least some embodiments take the form of a curve, possibly with sudden jumps in the profile of the curve at certain points, for the reasons discussed below.

The prior art type degeneration illustrated by the line Y causes the timing to improve gradually, as the size of each array decreases by 2 rows. The graph is very linear. Whilst timing may well be better when compared with the technique of embodiments of the present invention, granularity is much coarser—the size of the instance can only be decreased by 2*(number of banks) rows at a time.

With regard to the techniques of embodiments of the present invention, the timing does not change much when rows are subtracted from a bank, because other banks' timing becomes limiting, and the size of those does not change. However, a jump (i.e. a "stairstep") is likely to appear in the curve X when a whole bank gets chopped off (or degenerated down to nothing). When the instance is degenerated to a small single bank, the two lines (X and Y) could actually meet or even cross. The scheme of embodiments of the present invention hence provides the capability to change the memory capacity by only a small number of rows (e.g. 2 rows) at a time for the entire instance (not per bank), but may suffer from a slight performance penalty in some configurations.

Figure 7:
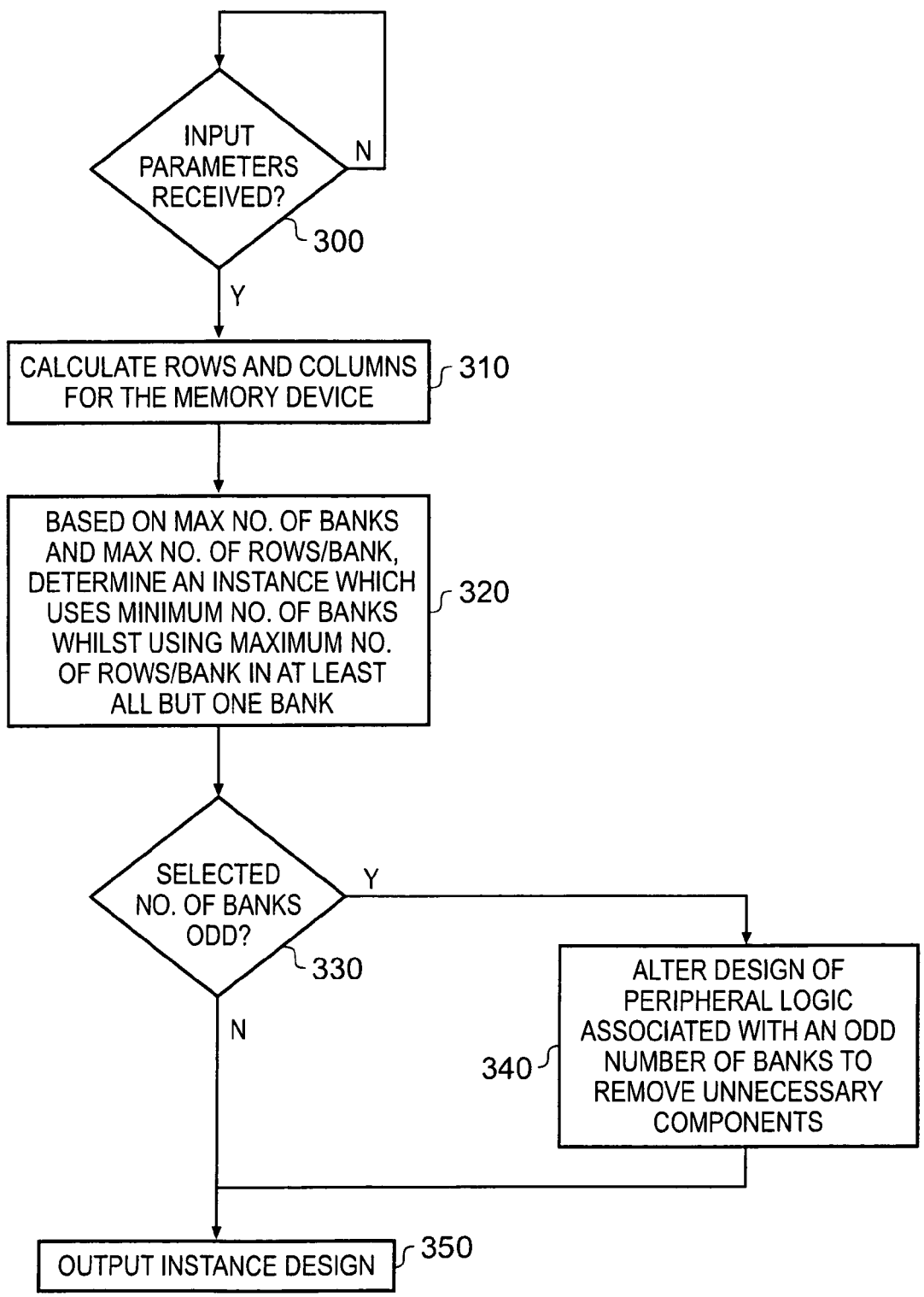
FIG. 7 is a flow diagram illustrating the operation of the degeneration scheme in one embodiment of the present invention.

FIG. 7 is a flow diagram illustrating the degeneration process in accordance with one embodiment of the present invention. At step 300, some input parameters are received, these typically being input by a user of the compiler tool used to run the degeneration process. In one embodiment, these parameters identify the number of words that the memory device needs to be able to store, the size of the multiplexer that will be used when accessing the memory, and the number of input/output bits that will be provided for accessing the memory. Based on these input parameters, the process will determine at step 310 the rows and columns that should be provided for the memory device. The actual number of rows required can be calculated by dividing the number of words by the specified multiplexer size, whilst the number of columns can be calculated by multiplying the number of input/output bits by the specified multiplexer size. The number of rows calculated in the above way will be rounded up to the nearest integer that is a multiple of two so as to allow it to correlate with one of the possible instances of the degeneration scheme.

Thereafter, at step 320, the degeneration process will be used to determine an instance of the banked memory architecture which uses the minimum number of banks required to support the calculated rows at step 310, whilst using the maximum number of rows per bank in at least all but one bank. In performing such a determination, the degeneration process will have regard to the maximum number of banks possible and the maximum number of rows per bank, as discussed earlier this being specified by the banked memory architecture.

In one embodiment, once this step is performed, the output instance design can thereafter be output. However, in accordance with one embodiment of the present invention, the additional steps 330, 340 are added. In particular, at step 330 it is determined whether the selected number of banks is odd. If not, then the process proceeds to step 350 where the instance design is output. However, if the selected number of banks is odd, then at step 340 the design of the peripheral logic associated with an odd number of banks is altered in order to remove any unnecessary components. In particular, as discussed earlier, such peripheral logic will typically contain some circuits which are shared between a pair of banks, and some circuits which are unique to one bank or the other of the pair. Accordingly, any such circuits which are unique to the bank which is not being provided in accordance with the instance design determined at step 320 can be removed, to thereby produce a more efficient design of peripheral logic to be associated with the unpaired bank.

Thereafter, at step 350, the instance design is output, and from this instance design, the actual memory device can be produced using any of a number of known techniques.

FIG. 8 is a chart illustrating some instances which can be produced when adopting the degeneration scheme of an embodiment of the present invention. The left hand column of the chart shows the number of rows calculated at step 310. This will dictate the number of address bits N needed to address those rows, as shown in the second column. Based on this, the degeneration scheme will then produce a design having a certain number of banks with the rows being partitioned amongst those banks. A certain number of the address bits N will then be needed to produce a bank select signal whilst the remaining bits will be used for a row select signal. The actual calculations performed by the degeneration scheme to work out the address decoding are as follows:

Word increment=2*mux
Total word count=((512−32)/2+1)*mux=241*mux words
Bank=div((rows−1)/64)+1
ax[m:0]=local row select, m={4,5}
ax[n:m+1]=bank select, n={6,7,8}

As can be seen from FIG. 8, if the number of rows are 32 or 64, then assuming the earlier example of a banked memory architecture where the maximum number of rows per bank is 64, and the maximum number of banks is 8, it will be appreciated that only a single bank needs to be provided, and accordingly the bank select signal is not applicable. Instead, all of the address bits are used as row select signals. However, if the number of rows specified is 128, then two banks will be provided, with the most significant bit of the address being used as a bank select signal and the remaining bits being used as row select signals. Similarly, if 256 rows are specified, then four banks are required, with the most significant two bits of the address being used as a bank select signal and the remaining bits of the address being used as row select signals. Similarly, if the number of rows required is 512, then eight banks need to be provided with the most significant three bits being used as the bank select signal, and the remaining address bits being used as row select signals.

Figure 9:
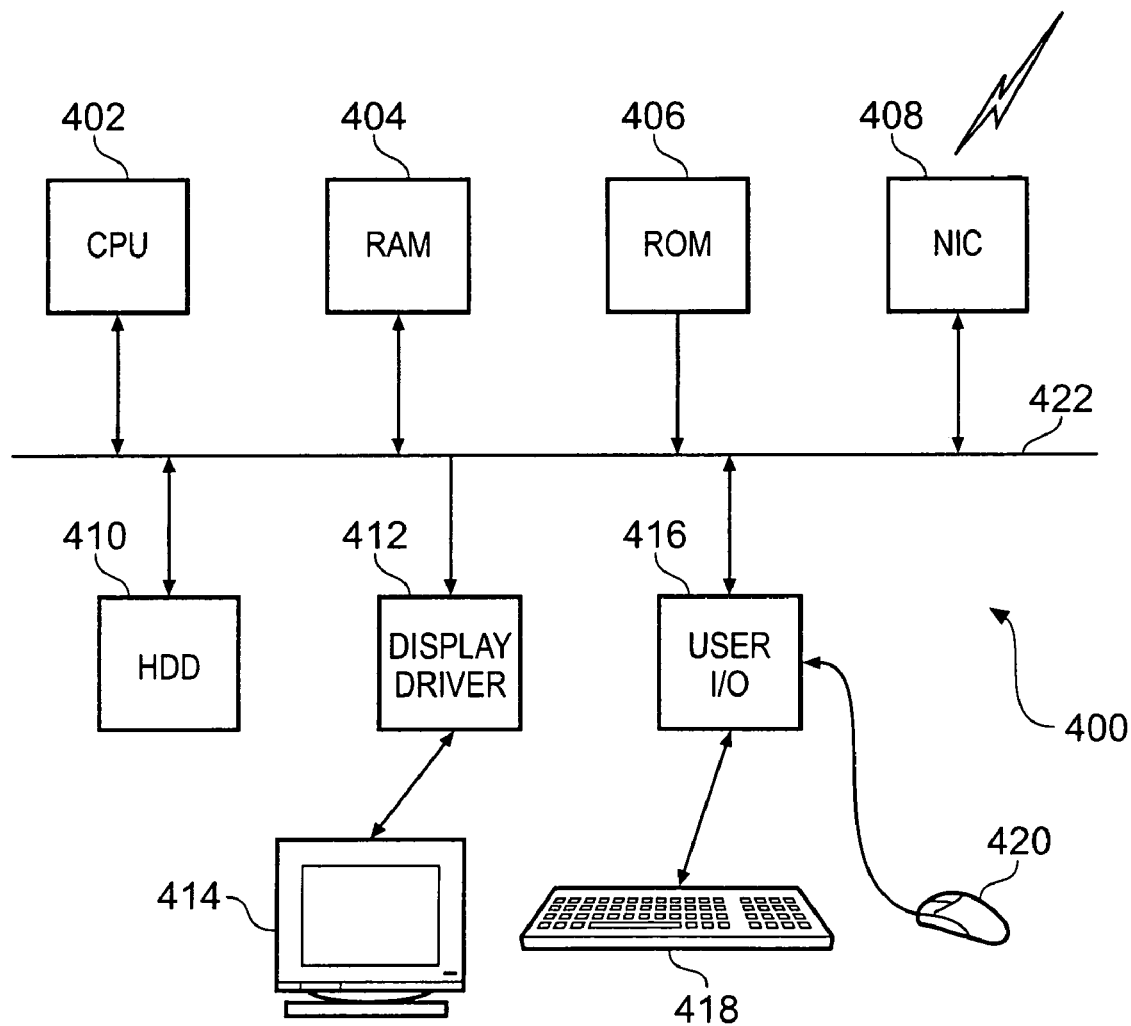
FIG. 9 is a diagram of a computer system on which the degeneration scheme of embodiments of the present invention may be performed.

FIG. 9 schematically illustrates a general purpose computer 400 of the type that may be used to implement the above described degeneration techniques. The general purpose computer 400 includes a central processing unit 402, a random access memory 404, a read only memory 406, a network interface card 408, a hard disk drive 410, a display driver 412 and monitor 414 and a user input/output circuit 416 with a keyboard 418 and mouse 420 all connected via a common bus 422. In operation the central processing unit 402 will execute computer program instructions that may be stored in one or more of the random access memory 404, the read only memory 406 and the hard disk drive 410 or dynamically downloaded via the network interface card 408. The results of the processing performed may be displayed to a user via the display driver 412 and the monitor 414. User inputs for controlling the operation of the general purpose computer 400 may be received via the user input output circuit 416 from the keyboard 418 or the mouse 420 (and hence for example the input parameters used to determine certain properties of the required memory device can be entered via this mechanism). It will be appreciated that the computer program could be written in a variety of different computer languages. The computer program may be stored and distributed on a recording medium or dynamically downloaded to the general purpose computer 400. When operating under control of an appropriate computer program, the general purpose computer 400 can perform the above described degeneration techniques and can be considered to form an apparatus for performing the above described techniques. The architecture of the general purpose computer 400 could vary considerably and FIG. 9 is only one example.

In accordance with embodiments of the present invention, a degeneration scheme is provided which can enable instances to be produced defining memory devices having high performance, low power consumption, and good area efficiency. The technique provides a great deal of flexibility as to the number of rows which can be provided by instances of the banked memory architecture and provide a very fine level of granularity over the number of rows provided. Such a scheme is particularly beneficial in highly banked memory architectures where the known prior art techniques lead to very coarse granularities in the possible number of rows that can be provided, thereby adversely affecting performance, power consumption and area efficiency in many instances.

It will be appreciated that the above-described degeneration scheme of an embodiment of the present invention can be varied in a number of ways, for example with respect to the order of degeneration (as mentioned earlier the bank address can be in a random order, as the physical location of any particular bank within the instance is not important), whether degeneration is started at the top or the bottom of the memory space, how many rows are removed between each instance of the degeneration scheme, etc.

Typically compiler data is generated by performing a curve-fitting process on a few selected points of user specified input parameters. The curve then has some small steps introduced into it (instead of forming one smooth continuous line) as a result of a step change in delay which occurs while removing unused peripheral logic. In accordance with embodiments of the present invention, the channel area overhead is reduced with only a minor penalty on the curve fitting the data.

The degeneration scheme of embodiments of the present invention can be applied to any type of banked memory architecture, for example read only memory (ROM), dual port read/write memories, etc.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A method of producing a design for a memory device from a banked memory architecture, the banked memory architecture specifying a maximum number of memory banks and a maximum number of rows per memory bank, the method comprising the steps of:
   (a) receiving input parameters indicating a number of properties of said memory device, said properties comprising at least a number of rows R for said memory device;
   (b) performing a degeneration process on the banked memory architecture in order to produce said design of a memory device having said properties, the degeneration process comprising the steps of:
      (i) selecting a number of memory banks B for said design, where said number is an integer less than or equal to the maximum number of memory banks specified by the banked memory architecture, and B is not constrained to be a factor of R; and
      (ii) partitioning the number of rows R amongst said memory banks selected at said step (b)(i) such that in each memory bank the number of rows in that memory bank is an integer less than or equal to the maximum number of rows per memory bank specified by the banked memory architecture.

2. A method as claimed in claim 1, wherein said step (b)(i) is performed so as produce a minimum number of memory banks required for said memory device to have said properties.

3. A method as claimed in claim 2, wherein said step (b)(ii) is performed so as to provide the maximum number of rows per memory bank in at least all but one of said memory banks of said design.

4. A method as claimed in claim 1, wherein the banked memory architecture specifies peripheral logic shared between a pair of memory banks, said degeneration process further comprising the step of:
   if at said step (b)(i) an odd number of memory banks are selected, performing a removal process to remove one or more components from any peripheral logic that is associated with an unpaired memory bank.

5. A method as claimed in claim 1, wherein at said step (a) said number of properties are derived from said input parameters, when deriving said number of rows R, said number of rows is selectable as any multiple of two less than or equal to a maximum number of rows supported by the banked memory architecture.

6. A method as claimed in claim 1, wherein said input parameters comprise a number of words to be stored by the memory device, a multiplexer size for the memory device and a number of input/output bits for the memory device, and said number of properties are derived therefrom, said properties comprising said number of rows R and a number of columns for said memory device.

7. A computer readable storage medium carrying a computer program, the computer program being operable to cause a computer system to perform a method for producing a design of a memory device from a banked memory architecture, the banked memory architecture specifying a maximum number of memory banks and a maximum number of rows per memory bank, the method comprising the steps of:
   (a) receiving input parameters indicating a number of properties of said memory device, said properties comprising at least a number of rows R for said memory device;
   (b) performing a degeneration process on the banked memory architecture in order to produce said design of a memory device having said properties, the degeneration process comprising the steps of:
      (i) selecting a number of memory banks B for said design, where said number is an integer less than or equal to the maximum number of memory banks specified by the banked memory architecture, and B is not constrained to be a factor of R; and
      (ii) partitioning the number of rows R amongst said memory banks selected at said step (b)(i) such that in each memory bank the number of rows in that memory bank is an integer less than or equal to the maximum number of rows per memory bank specified by the banked memory architecture.

8. A design of a memory device produced from a banked memory architecture by performing a method as claimed in claim 1.

9. A system for producing a design of a memory device from a banked memory architecture, the banked memory architecture specifying a maximum number of memory banks and a maximum number of rows per memory bank, the system comprising:
   an input for receiving input parameters indicating a number of properties of said memory device, said properties comprising at least a number of rows R for said memory device;
   degeneration logic for performing a degeneration process on the banked memory architecture in order to produce said design of a memory device having said properties, the degeneration process comprising the steps of:
      (i) selecting a number of memory banks B for said design, where said number is an integer less than or equal to the maximum number of memory banks specified by the banked memory architecture, and B is not constrained to be a factor of R; and
      (ii) partitioning the number of rows R amongst said memory banks selected at said step (i) such that in each memory bank the number of rows in that memory bank is an integer less than or equal to the maximum number of rows per memory bank specified by the banked memory architecture.

* * * * *